United States Patent
Taguchi

(10) Patent No.: US 10,658,275 B2
(45) Date of Patent: May 19, 2020

(54) RESIN-ENCAPSULATED SEMICONDUCTOR DEVICE

(71) Applicant: SII Semiconductor Corporation, Chiba-shi, Chiba (JP)

(72) Inventor: Yasuhiro Taguchi, Chiba (JP)

(73) Assignee: ABLIC INC., Chiba (JP)

( * ) Notice: Subject to any disclaimer, the term of this patent is extended or adjusted under 35 U.S.C. 154(b) by 27 days.

(21) Appl. No.: 15/420,642

(22) Filed: Jan. 31, 2017

(65) Prior Publication Data
US 2017/0221804 A1    Aug. 3, 2017

(30) Foreign Application Priority Data

Feb. 2, 2016  (JP) .................................. 2016-018091

(51) Int. Cl.
*H01L 23/495* (2006.01)
*H01L 23/29* (2006.01)
(Continued)

(52) U.S. Cl.
CPC ........ *H01L 23/49568* (2013.01); *H01L 23/28* (2013.01); *H01L 23/293* (2013.01); *H01L 23/3107* (2013.01); *H01L 23/3114* (2013.01); *H01L 23/495* (2013.01); *H01L 23/49503* (2013.01); *H01L 23/49517* (2013.01); *H01L 23/49541* (2013.01); *H01L 23/49548* (2013.01); *H01L 23/49551* (2013.01); *H01L 24/48* (2013.01); *H01L 24/73* (2013.01);
(Continued)

(58) Field of Classification Search
CPC ......... H01L 23/49503; H01L 23/49513; H01L 23/49568; H01L 23/49517; H01L 23/49524; H01L 23/293; H01L 2924/181; H01L 24/73; H01L 24/48; H01L 2224/73265; H01L 2224/48247; H01L 2224/48091; H01L 23/3114; H01L 23/28–3142
See application file for complete search history.

(56) References Cited

U.S. PATENT DOCUMENTS 4,684,975 A * 8/1987 Takiar ............... H01L 23/49568
174/548
4,916,506 A * 4/1990 Gagnon ............ H01L 23/49541
257/675
(Continued)

FOREIGN PATENT DOCUMENTS

| JP | 11-297916 A | 10/1999 |
|---|---|---|
| JP | 2000243891 A * | 9/2000 |
| JP | 2001015669 A * | 1/2001 |

*Primary Examiner* — Ismail A Muse
(74) *Attorney, Agent, or Firm* — Brinks Gilson & Lione

(57) ABSTRACT

Provided is a resin-encapsulated semiconductor device in which heat dissipation characteristic and mounting strength to a substrate are improved. Heat dissipation outer leads connected to inner leads connected to the four corners of a die pad are exposed to the outside of an encapsulating resin to improve the heat dissipation characteristic. The ends of the heat dissipation outer leads are cut in lead frame pressing, and exterior plating films are formed on the entire surfaces of the heat dissipation outer leads including the ends in exterior plating of the resin-encapsulated semiconductor device, permitting easy formation of solder fillet when the semiconductor device is mounted on a substrate.

6 Claims, 7 Drawing Sheets

(51) Int. Cl.
*H01L 23/31* (2006.01)
*H01L 23/00* (2006.01)
*H01L 23/28* (2006.01)

(52) U.S. Cl.
CPC .............. *H01L 24/32* (2013.01); *H01L 24/45* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2924/15153* (2013.01); *H01L 2924/181* (2013.01)

(56) References Cited

U.S. PATENT DOCUMENTS

| | | | | |
|---|---|---|---|---|
| 5,028,741 A * | 7/1991 | Sanders | .............. | H01L 23/4334 174/526 |
| 5,138,430 A * | 8/1992 | Gow, 3rd et al. | .. | H01L 23/3121 257/712 |
| 5,172,213 A * | 12/1992 | Zimmerman | ....... | H01L 23/4334 165/80.2 |
| 5,293,066 A * | 3/1994 | Tsumura | ........... | H01L 23/49531 257/666 |
| 5,420,751 A * | 5/1995 | Burns | ................... | H01L 21/565 165/185 |
| 5,666,003 A * | 9/1997 | Shibata | ................ | H01L 21/565 257/712 |
| 6,204,553 B1 * | 3/2001 | Liu | ................... | H01L 23/49503 257/669 |
| 6,242,800 B1 * | 6/2001 | Munos | ................... | H01L 23/49562 257/696 |
| 7,057,273 B2 * | 6/2006 | Harnden | ............. | H01L 23/3107 257/696 |
| 7,332,806 B2 * | 2/2008 | Joshi | ................... | H01L 23/495 257/276 |
| 2003/0127711 A1 * | 7/2003 | Kawai | ................ | H01L 21/4842 257/666 |
| 2006/0145318 A1 * | 7/2006 | Zhang | ............... | H01L 23/49562 257/676 |
| 2007/0052070 A1 * | 3/2007 | Islam | .................... | H01L 21/561 257/666 |
| 2007/0281392 A1 * | 12/2007 | Yee | ..................... | H01L 23/3107 438/111 |
| 2008/0290483 A1 * | 11/2008 | Yurino | .............. | H01L 23/49541 257/670 |
| 2009/0127681 A1 * | 5/2009 | Son | ....................... | H01L 21/565 257/675 |
| 2009/0200649 A1 * | 8/2009 | Tanaka | .............. | H01L 23/49503 257/676 |
| 2010/0123226 A1 * | 5/2010 | Chen | ................. | H01L 23/49503 257/670 |
| 2010/0171201 A1 * | 7/2010 | Wyant | ............... | H01L 23/49503 257/676 |
| 2010/0290202 A1 * | 11/2010 | Sasaki | ................. | H01L 21/4821 361/767 |
| 2012/0032316 A1 * | 2/2012 | Nishikawa | ............ | H01L 21/565 257/676 |
| 2012/0108013 A1 | 5/2012 | Fujisawa et al. | | |
| 2013/0140714 A1 * | 6/2013 | Numazaki | ............. | H01L 23/495 257/782 |
| 2014/0008776 A1 * | 1/2014 | Soller | ................ | H01L 23/49568 257/675 |
| 2015/0069572 A1 * | 3/2015 | Khanolkar | .......... | H01F 27/2804 257/531 |
| 2015/0206829 A1 * | 7/2015 | Au | .................... | H01L 23/49541 257/670 |
| 2015/0221582 A1 * | 8/2015 | Miyakawa | ........ | H01L 23/49524 257/676 |
| 2015/0243589 A1 * | 8/2015 | Ho | ........................ | H01L 27/088 257/329 |
| 2016/0254214 A1 * | 9/2016 | Makino | ............... | H01L 24/97 257/676 |
| 2017/0150601 A1 * | 5/2017 | Suzuki | ............. | H01L 23/49861 |
| 2017/0178787 A1 * | 6/2017 | Massolini | ................ | B22F 3/10 |
| 2019/0148173 A1 * | 5/2019 | Taguchi | ................ | H01L 21/565 438/123 |
| 2019/0371713 A1 * | 12/2019 | Taguchi | .................. | H01L 24/49 |

\* cited by examiner

RESIN-ENCAPSULATED SEMICONDUCTOR DEVICE

RELATED APPLICATIONS

This application claims priority under 35 U.S.C. § 119 to Japanese Patent Application No. 2016-018091 filed on Feb. 2, 2016, the entire content of which is hereby incorporated by reference.

BACKGROUND OF THE INVENTION

1. Field of the Invention

The present invention relates to a resin-encapsulated semiconductor device in which heat dissipation characteristic and mounting strength to a substrate are improved, and a method of manufacturing the resin-encapsulated semiconductor device.

2. Description of the Related Art

Resin-encapsulated semiconductor devices represented by power semiconductors need to have heat dissipation characteristics, and generally have the structure in which the back surface of a die pad is exposed from an encapsulating resin in order to efficiently release, to a mounting substrate, heat generated by a semiconductor chip. For example, a resin-encapsulated semiconductor device called an HSOP is registered in the international standards (JEDEC: MS-012). In the resin-encapsulated semiconductor device of such type, heat generated by the semiconductor chip is transferred to the mounting substrate from a heat dissipation plate exposed from the encapsulating resin, thereby being emitted to the outside of the semiconductor device. This enables obtainment of intended heat dissipation characteristics. In addition, as a method of improving heat dissipation characteristics, there is proposed a technology in which a die pad and inner leads are coupled to each other such that heat is released to a mounting substrate through outer leads connected to the inner leads (for example, see Japanese Patent Application Laid-open No. Hei 11-297916).

FIG. 5A to FIG. 5C are views of a related-art resin-encapsulated semiconductor device. FIG. 5A is a front surface perspective view. FIG. 5B is a back surface perspective view. FIG. 5C is a sectional view taken along the cutting line A-A illustrated in FIG. 5B. In the resin-encapsulated semiconductor device illustrated in FIG. 5A to FIG. 5C, a semiconductor chip 7 is mounted on a die pad 1 with die attach paste 6, and heat dissipation leads 19 extended from the die pad 1 are arranged on both the sides of the die pad. Further, terminals each including an inner lead 3 and an outer lead 2 are provided at the corner portions of the die pad 1. The terminals sandwich the heat dissipation lead 19 and are electrically connected to the semiconductor chip 7 through wires 5.

The semiconductor chip 7, the inner leads 3, and the wires 5 are covered with an encapsulating resin 8, and a heat dissipation surface 10 of the die pad 1, the outer leads 2, and the heat dissipation leads 19 are exposed from the encapsulating resin 8.

In the resin-encapsulated semiconductor device disclosed in Japanese Patent Application Laid-open No. JP11-297916, the semiconductor chip 7 is mounted at the center of the die pad 1, and the heat dissipation leads 19 are arranged near the semiconductor chip 7. Thus, satisfactory heat dissipation characteristics may be obtained. However, the inner leads 3 provided at the corner portions of the semiconductor device are away from the semiconductor chip, and the wires to be used for electrical connection tend to be long. Expensive wires, e.g., gold wires, are used as the wires, which greatly contributes to a package cost. There is also a problem in that the increase in electrical resistance increases power consumption, helping heat accumulation in the package.

SUMMARY OF THE INVENTION

The present invention has been made in view of the above-mentioned problems, and has an object to provide an inexpensive semiconductor device that maintains satisfactory heat dissipation characteristics, and a method of manufacturing the semiconductor device.

In order to solve the above-mentioned problems, the following measures are taken in one embodiment of the present invention.

In a resin-encapsulated semiconductor device, first, a die pad is exposed from an encapsulating resin to serve as a heat dissipation plate. In addition, heat dissipation outer leads connected to inner leads connected to the die pad are arranged at the four corners of the die pad. The ends of the heat dissipation outer leads are cut in a lead frame processing stage such that, after exterior plating of the semiconductor device, exterior plating films are formed on the entire surfaces of the ends of the heat dissipation outer leads without fail.

As described above, according to the present invention, the heat dissipation area of the resin-encapsulated semiconductor device is increased due to the heat dissipation outer leads connected to the inner leads connected to the four corners of the die pad, with the result that heat dissipation characteristics of the resin-encapsulated semiconductor device can be improved. The improvement in heat dissipation characteristics can be achieved without increasing the semiconductor device in size.

Further, exterior plating films can be formed on the entire surfaces of the ends of the heat dissipation outer leads. As a consequence, mounting strength that is important when the semiconductor device is mounted on a substrate can be improved without fail.

In addition, the heat dissipation outer leads connected to the inner leads connected to the die pad are provided at the four corners of the die pad, and hence the inner leads that are electrically connected to the semiconductor chip and are not connected to the die pad are arranged in the center portion of the die pad. In general, the semiconductor chip is mounted at the center of the die pad, and hence the lengths of wires for electrically connecting the semiconductor chip to the inner leads can be reduced.

DETAILED DESCRIPTION OF THE PREFERRED EMBODIMENTS

Now, a mode for carrying out the present invention is described with reference to the drawings.

Figure 1:
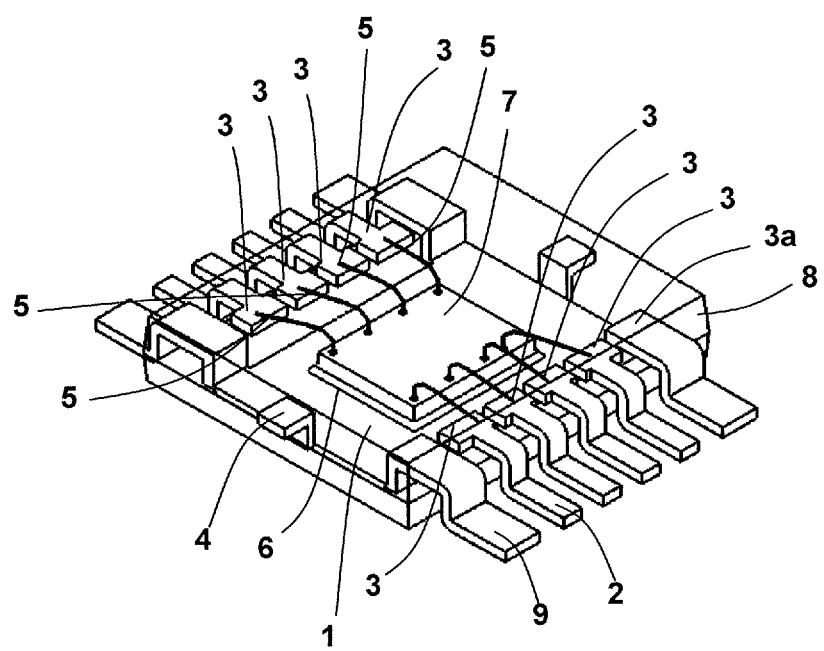
FIG. 1 is a transparent view for illustrating a resin-encapsulated semiconductor device according to an embodiment of the present invention.

FIG. 1 is a transparent view for illustrating a resin-encapsulated semiconductor device according to an embodiment of the present invention. FIG. 1 is a schematic view of the internal structure, for illustrating a semiconductor chip, inner leads, and other components with a transparent encapsulating resin.

A semiconductor chip 7 is fixed on a rectangular die pad 1 by die attach paste 6, and the die pad 1 is fixed by suspension pins 4 provided at locations opposite to each other. On both the sides of a pair of sides that is different from the pair of sides on which the suspension pins 4 are provided, a plurality of inner leads 3 and outer leads 2 connected to the inner leads are provided. A bonding pad is provided on the semiconductor chip so as to be in parallel with the sides of the die pad on which the inner leads are arranged, and the bonding pad and the inner leads 3 are electrically connected to each other through wires 5. Further, heat dissipation outer leads 9 are provided at the four corners of the die pad 1 through heat dissipation inner leads 3a connected to the die pad.

The heat dissipation outer leads 9 are extended from the heat dissipation inner leads 3a, and connected to the heat dissipation inner leads 3a. The heat dissipation outer leads 9 are bent like the outer leads 2. The back surface of the resin-encapsulated semiconductor device, the back surfaces of the heat dissipation outer leads 9, and the back surfaces of the outer leads 2 are flush with each other. From the back surface of the resin-encapsulated semiconductor device, the back surface of the die pad is exposed as described later. The heat dissipation outer leads 9 provided at the four corners have a width larger than that of the outer leads 2, and play a role in transferring heat generated by the semiconductor chip to release the heat to the outside of the semiconductor device.

Figure 5A:
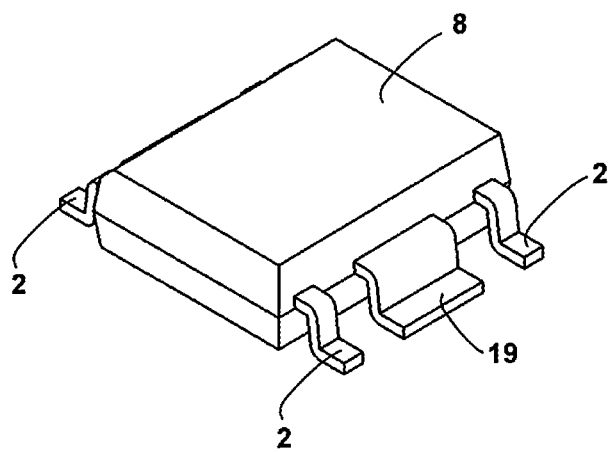
FIG. 5A, FIG. 5B, and FIG. 5C are views for illustrating a related-art resin-encapsulated semiconductor device.
Figure 5B:
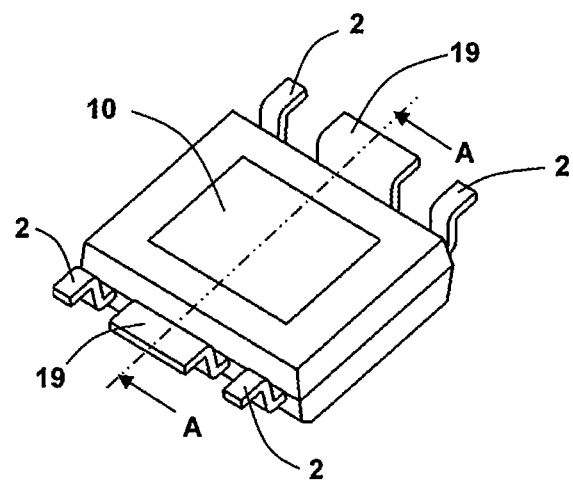
Figure 5C:
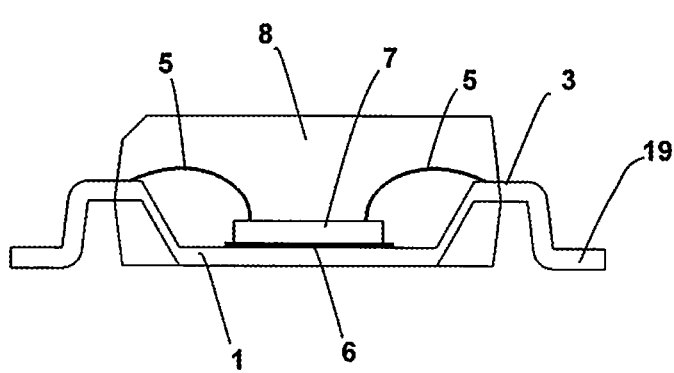

In the semiconductor device illustrated in FIG. 5A to FIG. 5C, the heat dissipation leads are provided only on both the sides of the semiconductor chip, and hence heat is liable to be accumulated at locations at which no heat dissipation lead is provided, thereby affecting the operation of the semiconductor chip in some cases. In contrast, in the case of the semiconductor device of the present invention, the influence of heat on the operation is small because the heat dissipation leads each including the heat dissipation inner lead 3a and the heat dissipation outer lead 9 are provided at the four corners. In general, an amount of heat generated by the semiconductor chip varies depending on semiconductor elements formed in the semiconductor chip, and hence heat is non-uniformly generated on the semiconductor chip. With the configuration in which the heat dissipation leads having a width larger than those of the other heat dissipation leads are provided near locations at which a large amount of heat is generated, more satisfactory heat dissipation characteristics may be obtained.

Figure 2A:
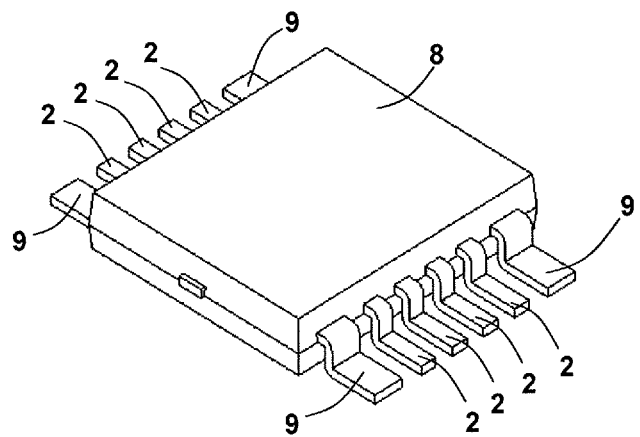
FIG. 2A and FIG. 2B are perspective views for illustrating the resin-encapsulated semiconductor device according to the embodiment of the present invention.
Figure 2B:
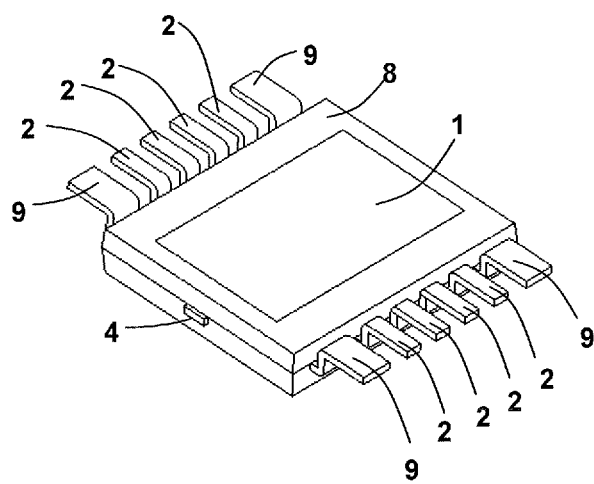

FIG. 2A and FIG. 2B are perspective views for illustrating the resin-encapsulated semiconductor device according to the embodiment of the present invention. FIG. 2A is a top surface perspective view, and FIG. 2B is a back surface perspective view. On both the sides of the encapsulating resin 8, the plurality of outer leads 2 are exposed at locations opposite to each other, and the pair of heat dissipation outer leads 9 is provided so as to sandwich the outer leads 2. On the back surface of the semiconductor device, a heat dissipation surface 10 is provided, which is a part of the die pad 1 exposed from the encapsulating resin, and the heat dissipation outer leads 9 are provided on the outer peripheral sides of the inner leads 2.

There is provided a resin-encapsulated semiconductor device having high heat dissipation characteristic and being capable of dissipating heat generated in the semiconductor chip 7 through the heat dissipation surface 10 exposed from the back surface of the die pad, and the heat dissipation outer leads 9 connected to the die pad 1 via the inner leads 3a.

Figure 3:
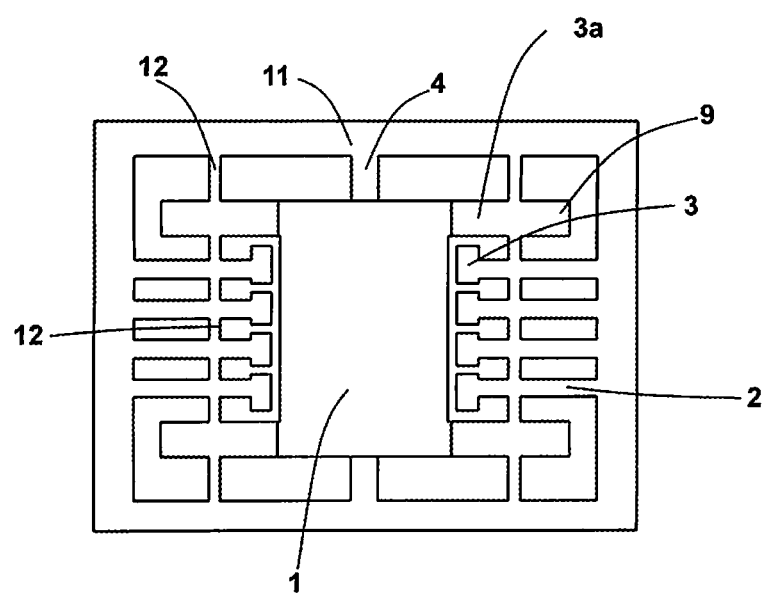
FIG. 3 is a plan view of a lead frame to be used for the resin-encapsulated semiconductor device according to the embodiment of the present invention.

FIG. 3 is a plan view of a lead frame 11 to be used for the resin-encapsulated semiconductor device according to the embodiment of the present invention. In FIG. 3, only a part of the lead frame to be used for one resin-encapsulated semiconductor device is illustrated. A lead frame to be used in an actual manufacturing process includes a large number of parts illustrated in FIG. 3, which are vertically and horizontally aligned in a two-dimensional manner.

In the lead frame 11 illustrated in FIG. 3, the heat dissipation inner leads 3a are arranged at the four corners of the die pad 1, and the heat dissipation outer leads 9 are extended from the heat dissipation inner leads 3a. Further, the heat dissipation outer leads 9 and the other outer leads 2 are coupled to each other by tie bars 12. In FIG. 3, the heat dissipation inner leads 3a are arranged at corner portions corresponding to the ends of the four corners of the die pad, and each short side of the die pad 1 and outer sides connected to the tie bars 12 of the heat dissipation outer leads 9 form a straight line. The heat dissipation outer leads 9 and the other outer leads 2 are bent such that the die pad 1 is located lower level than the heat dissipation outer leads 9 and the other outer leads 2. In addition, the ends of the heat dissipation outer leads 9 are not connected to the lead frame and are exposed. With this configuration, exterior plating films are formed even on the ends of the heat dissipation outer leads 9 in exterior plating, as described later.

Next, a method of manufacturing the embodiment of the present invention is described with reference to the drawings.

FIG. 4A to FIG. 4G are schematic structural views for illustrating the method of manufacturing the embodiment of the present invention.

Figure 4A:
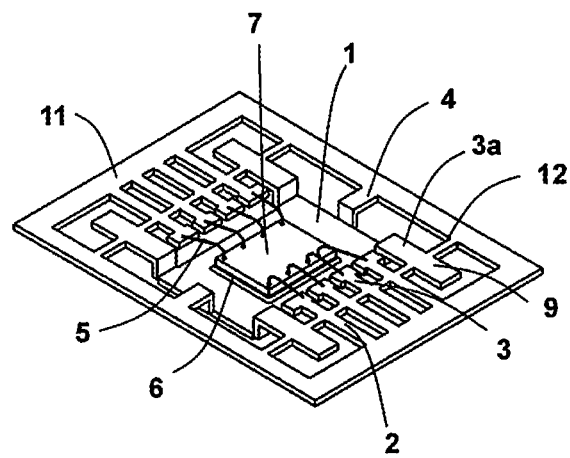
FIG. 4A, FIG. 4B, FIG. 4C, FIG. 4D, FIG. 4E, FIG. 4F, and FIG. 4G are views for illustrating a method of manufacturing the resin-encapsulated semiconductor device according to the embodiment of the present invention.

FIG. 4A is a front surface schematic perspective view for illustrating the method of manufacturing the resin-encapsulated semiconductor device according to the embodiment of the present invention in a state in which the components are not encapsulated in the resin yet.

In the lead frame 11 to be used for the resin-encapsulated semiconductor device according to the embodiment of the present invention, the die pad 1 is bent so as to be exposed from the encapsulating resin, and the semiconductor chip 7 is fixed on the die pad by the die attach paste 6. An electrode of the semiconductor chip 7 and the inner leads 3 are electrically connected to each other through the wires 5. The heat dissipation outer leads 9 are connected to the die pad 1 through the heat dissipation inner leads 3a. The ends of the heat dissipation outer leads 9 are exposed and are not connected to any component.

Figure 4B:
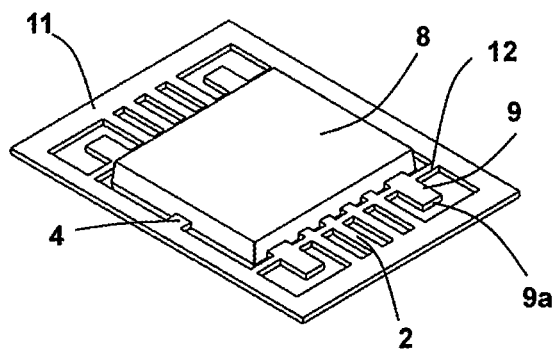

FIG. 4B is a front surface schematic perspective view for illustrating the resin-encapsulated semiconductor device according to the embodiment of the present invention in a state in which an unnecessary encapsulating resin is removed after the components are encapsulated in the resin.

The components are encapsulated from the front and back surfaces of the lead frame 11 by the encapsulating resin having a predetermined size. The lead frame 11, the outer leads 2, and the heat dissipation outer leads 9 are coupled to each other by the tie bars 12, and hence the encapsulating resin does not flow into the outer lead side.

Figure 4C:
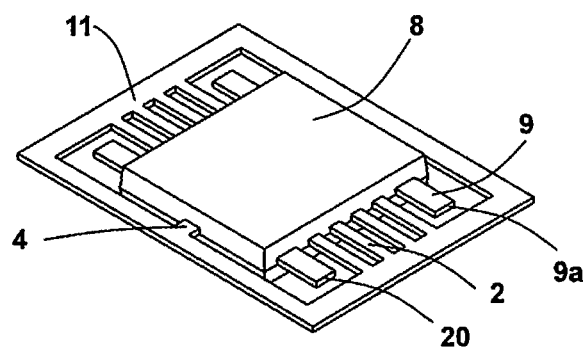

FIG. 4C is a front surface schematic perspective view for illustrating the resin-encapsulated semiconductor device according to the embodiment of the present invention in a state in which the tie bars 12 are cut after the components are encapsulated in the resin. The tie bars 12 coupled to the lead frame 11 are all cut while remaining predetermined widths of the outer leads 2 and the heat dissipation outer leads 9. After the tie bars 12 are cut, the lead frame 11 and the die pad 1 are connected to each other by the suspension pins 4. The heat dissipation outer leads connected to the die pad 1 are also connected to the lead frame 11 inside the encapsulating resin through the heat dissipation inner leads 3a. Next, exterior plating is performed through electrochemical machining. The heat dissipation outer leads are electrically connected to the lead frame 11, and hence exterior plating films 22 are formed on the entire surfaces of the heat dissipation outer leads including ends 9a.

Figure 4D:
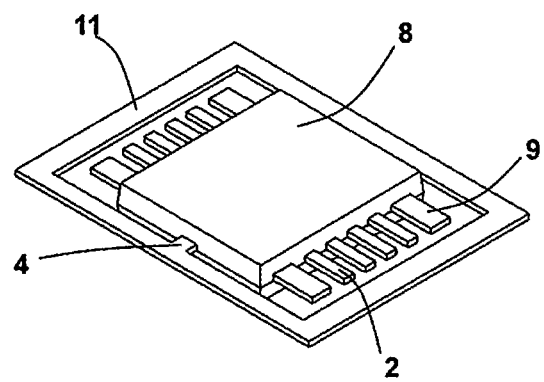

FIG. 4D is a front surface schematic perspective view for illustrating the resin-encapsulated semiconductor device according to the embodiment of the present invention in a state in which the outer leads 2 are cut at the ends so as to have a predetermined size after plating.

Figure 4E:
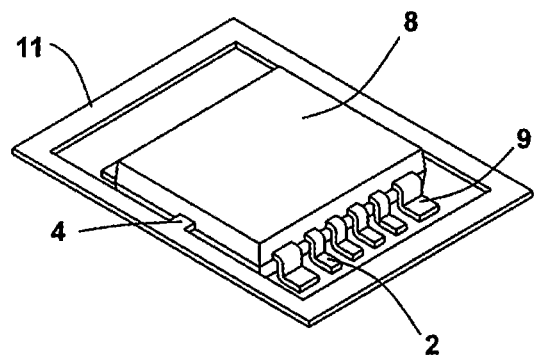

FIG. 4E is a front surface schematic perspective view for illustrating the resin-encapsulated semiconductor device according to the embodiment of the present invention in a state in which the outer leads 2 and the heat dissipation outer leads 9 are bent by degrees that enables the semiconductor device to be mounted on a substrate. Even when the outer leads 2 and the heat dissipation outer leads 9 are bent, the resin-encapsulated semiconductor device of the present invention is held on the lead frame 11 by the suspension pins 4. Under this state, testing contact pins are brought into contact with the outer leads 2 and the heat dissipation outer leads 9. In this way, the resin-encapsulated semiconductor device of the present invention can be tested to determine whether or not the semiconductor device operates without any problem.

Figure 4F:
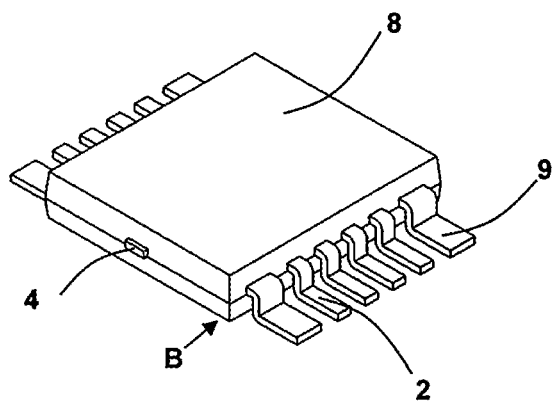

FIG. 4F is a front surface schematic perspective view for illustrating the resin-encapsulated semiconductor device according to the embodiment of the present invention in a completed state in which the suspension pins 4 connected to the lead frame 11 are cut at predetermined locations to obtain a singulated semiconductor device.

Figure 4G:
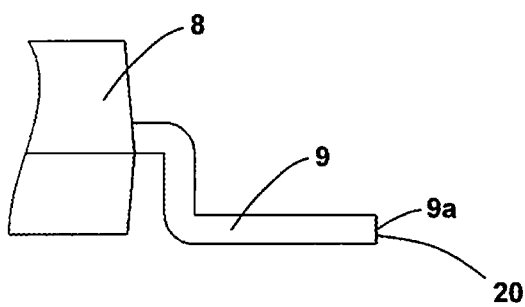

FIG. 4G is a view on arrow B of FIG. 4F. Exterior plating films 20 are formed on the entire surfaces of the ends 9a of the heat dissipation outer leads exposed from the encapsulating resin 8.

What is claimed is:

1. A resin-encapsulated semiconductor device, comprising:
    a semiconductor chip;
    a die pad having the semiconductor chip bonded thereon;
    a plurality of heat dissipation inner leads each connected to one of four corners of the die pad, and a plurality of heat dissipation outer leads each connected to one of the plurality of heat dissipation inner leads, respectively;
    a plurality of inner leads each electrically connected to the semiconductor chip through a metal wire, and a plurality of outer leads each connected to one of the plurality of inner leads, respectively, the plurality of inner leads and outer leads residing only along two opposing sides of the die pad and between the plurality of heat dissipation inner leads and outer leads
    wherein the plurality of heat dissipation inner leads are not electrically connected to the semiconductor chip by the metal wires; and
    an encapsulating resin encapsulating the die pad, the semiconductor chip, the plurality of inner leads, and the plurality of heat dissipation inner leads,
    wherein the plurality of heat dissipation inner leads and the plurality of inner leads extend parallel with each other and are on a same lateral plane within the encapsulating resin, and the plurality of heat dissipation inner leads and plurality of heat dissipation outer leads have a uniform width from the die pad to terminal ends thereof, where the uniform width is wider than a width of the plurality of inner leads and a width of the plurality of outer leads,
    a back surface of the die pad, the plurality of outer leads, and the plurality of heat dissipation outer leads being exposed from the encapsulating resin, and
    the back surface of the die pad, back surfaces of the plurality of outer leads, and back surfaces of the plurality of heat dissipation outer leads being flush.

2. The resin-encapsulated semiconductor device according to claim 1, wherein the plurality of heat dissipation inner leads are each connected to corner portions of the die pad.

3. The resin-encapsulated semiconductor device according to claim 1, wherein entire surfaces of the plurality of heat dissipation outer leads including ends of the plurality of heat dissipation outer leads have exterior plating films thereon.

4. A resin-encapsulated semiconductor device, comprising:
    a semiconductor chip;
    a die pad having the semiconductor chip bonded thereon;
    a plurality of heat dissipation inner leads each connected to one of four corners of the die pad, and a plurality of heat dissipation outer leads each connected to one of the plurality of heat dissipation inner leads, respectively;
    a plurality of inner leads each electrically connected to the semiconductor chip through a metal wire, and a plurality of outer leads each connected to one of the plurality of inner leads, respectively, the plurality of inner leads and outer leads residing only along two opposing sides of the die pad and between the plurality of heat dissipation inner leads and outer leads
    wherein each side orthogonal to the two opposing sides of the die pad and outer sides of the plurality of heat dissipation outer leads form straight line; and
    an encapsulating resin encapsulating the die pad, the semiconductor chip, the plurality of inner leads, and the plurality of heat dissipation inner leads,
    wherein the plurality of heat dissipation inner leads and the plurality of inner leads extend parallel with each other and are on a same lateral plane within the encapsulating resin, and the plurality of heat dissipation inner leads and plurality of heat dissipation outer leads have a uniform width from the die pad to terminal ends thereof, where the uniform width is wider than a width of the plurality of inner leads and a width of the plurality of outer leads,
    a back surface of the die pad, the plurality of outer leads, and the plurality of heat dissipation outer leads being exposed from the encapsulating resin, and
    the back surface of the die pad, back surfaces of the plurality of outer leads, and back surfaces of the plurality of heat dissipation outer leads being flush.

5. The resin-encapsulated semiconductor device according to claim 4, wherein the plurality of heat dissipation inner leads are each connected to corner portions of the die pad.

6. The resin-encapsulated semiconductor device according to claim 4, wherein entire surfaces of the plurality of heat dissipation outer leads including ends of the plurality of heat dissipation outer leads have exterior plating films thereon.

* * * * *